United States Patent [19]

Tigelaar et al.

[11] Patent Number: 5,079,670
[45] Date of Patent: Jan. 7, 1992

[54] METAL PLATE CAPACITOR AND METHOD FOR MAKING THE SAME

[75] Inventors: Howard L. Tigelaar, Allen; James L. Paterson, Richardson, both of Tex.

[73] Assignee: Texas Instruments Incorporated, Dallas, Tex.

[21] Appl. No.: 486,023

[22] Filed: Feb. 27, 1990

[51] Int. Cl.⁵ .................... H01L 27/02; H01L 29/68; H01L 21/94; H01G 4/06
[52] U.S. Cl. ...................... 361/313; 357/51; 357/23.6; 437/47
[58] Field of Search ............ 357/50, 55, 51, 41, 357/23.5, 23.6, 23 VT; 361/311, 312, 313, 321; 29/25.42, 571, 577 C; 437/47, 52; 174/68.5

[56] References Cited

U.S. PATENT DOCUMENTS

| | | | |
|---|---|---|---|
| 4,355,374 | 10/1982 | Sakai et al. | 357/51 |
| 4,410,867 | 10/1983 | Arcidiacono et al. | 333/172 |
| 4,419,812 | 12/1983 | Topich | 29/577 |
| 4,466,177 | 8/1984 | Chao | 29/571 |
| 4,472,726 | 9/1984 | DiMaria et al. | 357/6 |
| 4,589,056 | 5/1986 | Stimmell | 361/311 |
| 4,628,405 | 12/1986 | Lippert | 361/321 |
| 4,630,086 | 12/1986 | Sato et al. | 357/23.5 |
| 4,638,400 | 1/1987 | Brown et al. | 361/304 |
| 4,700,457 | 10/1987 | Matsukawa | 437/52 |
| 4,732,872 | 3/1988 | Komatsu | 437/47 |
| 4,760,034 | 7/1988 | Barden | 437/47 |
| 4,768,080 | 8/1988 | Sato | 357/54 |
| 4,771,322 | 9/1988 | Murotani | 357/23.6 |

FOREIGN PATENT DOCUMENTS 60-14168  8/1985  Japan.

OTHER PUBLICATIONS

Card et al., "Reversible Floating Memory", *J. Appl. Phys.*, vol. 44, No. 5, May 1973, pp. 2326-30.
Jambotkar et al., "Stacked Gate Device with Reduced '0' Static Threshold Voltage", *IBM Tech. Disc. Bull.*, vol. 22, No. 1, (1979), pp. 160-61.

Primary Examiner—Donald A. Griffin
Attorney, Agent, or Firm—James C. Kesterson; James T. Comfort; Melvin Sharp

[57] ABSTRACT

A metal-to-polysilicon capacitor, a floating-gate transistor containing such a capacitor, and a method for making the same is disclosed. The bottom plate of the capacitor is formed over a field oxide structure, and the multilevel dielectic is deposited thereover. The multilevel dielectric is removed from the capacitor area, and an oxide/nitride dielectric is deposited over the exposed bottom plate and over the multilevel by way of LPCVD. A first layer of titanium/tungsten is preferably deposited prior to contact etch, and the contacts to moat and unrelated polysilicon are formed. Metallization is sputtered overall, and the metal and titanium/tungsten are cleared to leave the metallization filling the contact holes, and a capacitor having a titanium/tungsten and metal top plate.

14 Claims, 7 Drawing Sheets

METAL PLATE CAPACITOR AND METHOD FOR MAKING THE SAME

This application is a continuation-in-part of application Ser. No. 189,930 filed May 3, 1988 which in turn is a continuation-in-part of application Ser. No. 938,653 filed Dec. 5, 1986, and now U.S. Pat. No. 4,811,076 issued Mar. 7, 1989.

This invention is in the field of integrated circuits, and is more specifically directed to the formation of capacitors in integrated circuits.

BACKGROUND OF THE INVENTION

In the field of integrated circuits, it is preferable to form circuit elements in the smallest achievable surface area, in order to realize a high degree of circuit complexity into a small integrated circuit chip size, resulting in lower cost per function. For circuits containing capacitors, such as those required in analog-to-digital converters (ADCs) and in non-volatile memories which use capacitive coupling between a control gate and a floating gate, the goal of large scale integration requires the provision of capacitors which are small in cross-sectional area but large in capacitance. Especially in the field of ADCs, the stability of the capacitance value over a range of applied voltage, and over a given temperature range, is additionally important in providing fast and accurate conversion.

Another consideration in the cost of fabricating integrated circuits is the complexity of the fabrication process. The process complexity can be increased in an attempt to save surface area by increasing the number of interconnect levels. For example, the footprint of a given integrated circuit may be reduced by using two, rather than one, levels of polysilicon gates and interconnects, under the overlying metallization layer(s). However, the process complexity is increased by including the additional polysilicon layer due to the added process steps of the deposition of an additional polysilicon layer, deposition of an additional dielectric layer, and patterning and etching the additional polysilicon layer and contacts thereto.

Furthermore, additional high temperature process steps performed after the formation of diffused junctions are detrimental to the ability to scale the transistors in an integrated circuit, as the additional high temperature steps cause the diffused dopants used in function formation to further diffuse, resulting in deeper junctions and wider lateral diffusion.

Furthermore, it is desirable that the manufacturing process flow for the fabrication of integrated circuits such as ADCs be as compatible as possible with the manufacturing process flows for other integrated circuits such as digital logic circuits. However, large value and low voltage coefficient capacitors such as are necessary in ADCs are generally not required in modern digital logic circuits. The incorporation of a special process flow for the fabrication of such capacitors at an early stage in the process would tend to reduce the compatibility of the process for fabricating the ADC with that for fabricating the digital logic circuits.

It is therefore an object of this invention to provide a capacitor which has a high specific capacitance, and therefore a high capacitance to surface area ratio.

It is another object of this invention to provide a method of forming such a capacitor.

It is another object of this invention to provide such a method which require a relatively low temperature processing.

It is another object of this invention to provide such a method requiring only a single level of polysilicon to form the capacitor.

It is another object of this invention to provide such a capacitor having a low voltage coefficient of capacitance.

It is another object of this invention to provide such a capacitor which may be fabricated at a late stage in the manufacturing process, so that the fabrication steps of the integrated circuit prior to the formation of the capacitor may be standardized with the fabrication steps for integrated circuits not including such capacitors.

Other objects and advantages of the invention will become apparent to those of ordinary skill in the art having reference to the following description, in conjunction with the drawings.

SUMMARY OF THE INVENTION

The invention may be incorporated into an integrated circuit capacitor with a polysilicon electrode as a bottom plate and a metal layer as a top plate. Subsequent to the formation of a patterned polysilicon layer, a multi-level dielectric is formed, and a via is etched therethrough to a polysilicon lower electrode. The capacitor dielectric is then deposited, such a dielectric preferably consisting of an oxide/nitride layered dielectric. Contacts are etched to diffusion and to polysilicon electrodes as desired, and metal is deposited and patterned to form the top electrode of the capacitor over the capacitor dielectric, and to make contact as desired to diffusion and to polysilicon.

DETAILED DESCRIPTION OF THE PREFERRED EMBODIMENT

Figure 1:
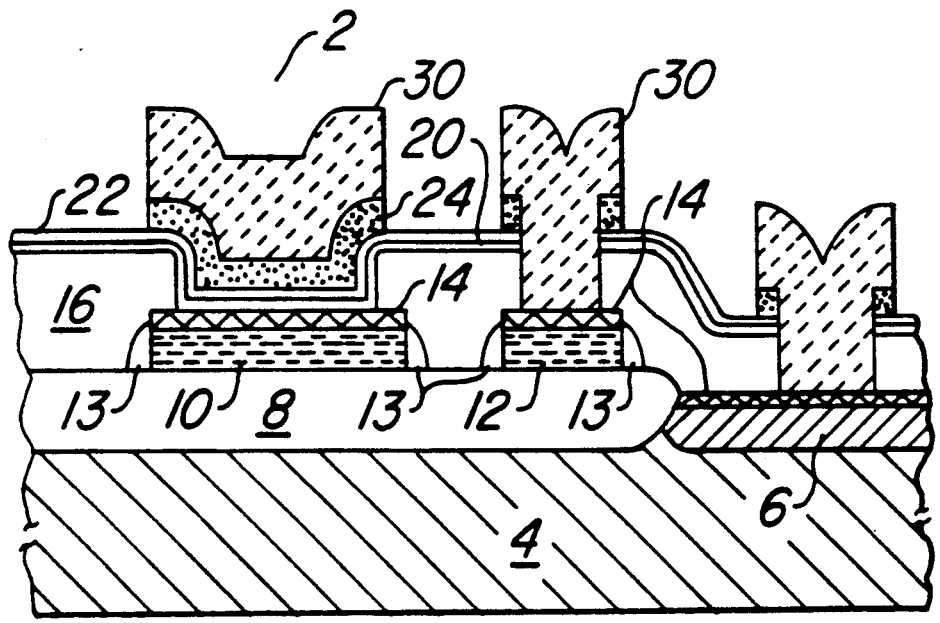
FIG. 1 is a cross-sectional diagram of a completed capacitor constructed according to the preferred embodiment of the invention.

Referring to FIG. 1, a cross-sectional diagram of a metal-to-polysilicon capacitor 2 constructed according to the invention is shown. Capacitor 2 is formed in this embodiment on top of field oxide 8 which is disposed at the surface of p-type substrate 4. Capacitor 2 has a lower plate formed of polycrystalline silicon which, in this embodiment, is clad with a refractory metal silicide 14. Silicide 14 is not essential in the construction of capacitor 2, but may be formed upon polysilicon 10 if silicide cladding is desired for other locations of the integrated circuit containing capacitor 2, as will be described below; such cladding also provides for additional stability of the capacitor 2. The capacitor dielectric for capacitor 2 consists of a layer of silicon dioxide 20 underlying a layer of silicon nitride 22. The embodiment shown in FIG. 1 having a 25 nm thickness for oxide 20 and a 25 nm thickness for nitride 22 provides a specific capacitance of approximately 1 fF per square micron. The top plate of capacitor 2 preferably consists of a titanium-tungsten alloy layer 24 underlying an aluminum, or aluminum alloy, layer 30. The provision of layer 24 facilitates fabrication of capacitor 2, as will be explained hereinbelow, but is not essential in the construction of capacitor 2. Layers 24 and 30 may be alternatively formed of any one of a number of standard metals used in metallization of integrated circuits, such as pure aluminum, doped aluminum (such as copper-doped aluminum and silicon-doped aluminum), or a multi-layer metal system such as one composed of a layer of an alloy of titanium-tungsten underlying a layer of copper-doped aluminum.

Figure 7:
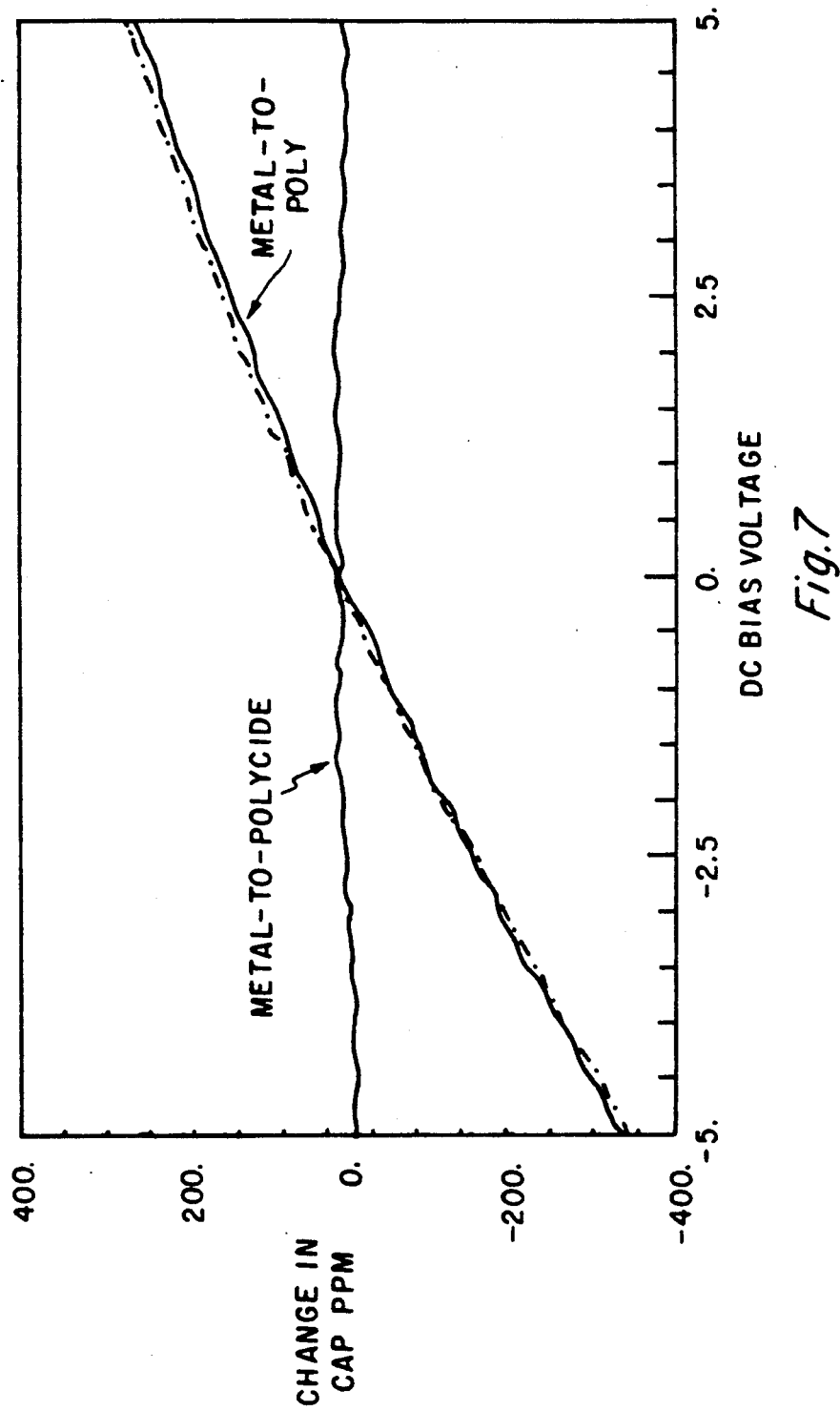
FIG. 7 is a graph illustrating the change in capacitance versus applied voltage for a metal to polysilicon capacitor and a metal to silicided polysilicon capacitor, fabricated according to the invention.

It has been found that capacitor 2 constructed as a metal-to-poly capacitor as shown in FIG. 1 has reduced, and thereby improved, coefficients of capacitance to voltage, and capacitance to temperature, as compared with poly-to-poly capacitors. This stability is further improved where the underlying polysilicon is clad with a silicide film. The poorer voltage coefficient for unsilicided polysilicon relative to silicided polysilicon is due to the depletion of the polysilicon grains adjacent to the capacitor dielectric as the applied voltage increases, decreasing the capacitance and in turn increasing the voltage coefficient of the capacitor. FIG. 7 is a graph of the change in capacitance versus applied voltage for a metal to unsilicided polysilicon capacitor and a metal to silicided polysilicon (polycide) capacitor having equivalent dielectric films. As will be further evident hereinbelow in the description of the method used to form capacitor 2, the formation of the dielectric and top plate of capacitor 2 may be done at relatively low temperatures, as compared to the formation of modern poly-to-poly capacitors.

Figure 2A:
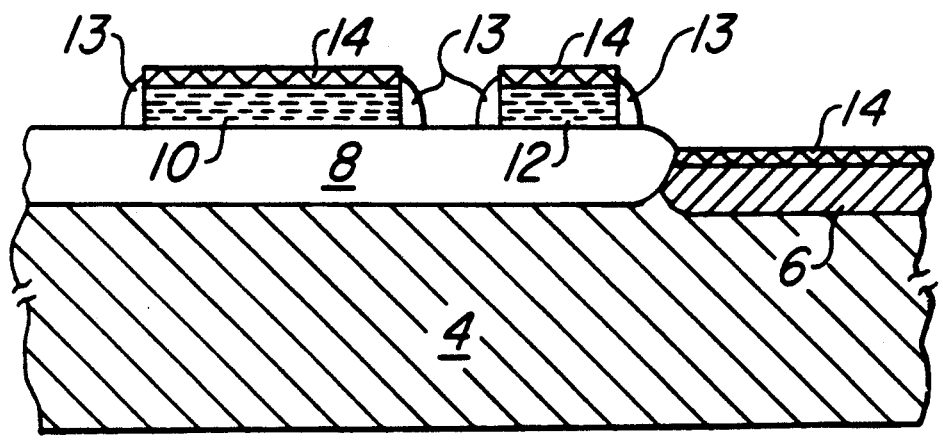
FIGS. 2a through 2h are cross-sectional diagrams illustrating various steps in the formation of the capacitor of FIG. 1.

Referring to FIGS. 2a through 2h, a method of forming capacitor 2 of FIG. 1 will be described in detail. FIG. 2a illustrates, in cross-section, a partially fabricated integrated circuit, formed into a p-type substrate 4. Field oxide structures 8 are formed in a manner well known in the art, such as the well known local oxidation (LOCOS) method. A polycrystalline layer is deposited overall, and is patterned and etched to form polysilicon structures 10 and 12. As described above, polysilicon structure 10 will serve as the bottom plate of capacitor 2; polysilicon structure 12 is a structure unrelated to capacitor 2, but which is shown here for explanatory purposes. The polysilicon layer used in the formation of structures 10 and 12 is preferably heavily doped so as to be relatively conductive, as in conventional integrated circuits; generally, the polysilicon layer will be doped n-type, and will be either implanted with n-type dopant, or may be in-situ doped during its deposition. N-type diffusion 6 is formed by way of ion implantation and subsequent diffusion into a location of the surface of p-type substrate 4 not covered by field oxide 8; diffusion 6 is generally formed after the formation and patterning of the polysilicon layer described above to form source and drain regions of MOS transistors in self-aligned fashion with the polysilicon gate electrode.

Diffusion 6, and polysilicon structures 10 and 12 in FIG. 2a are each shown clad with a refractory metal silicide film 14. As is well known in the art, it is preferable to form sidewall oxide filaments 13 on the sides of the polysilicon structures 10 and 12 so that the subsequent silicidation does not short out the polysilicon gate electrode in an MOS transistor to the source and drain diffusions. The silicide film is formed by the deposition of a refractory metal such as titanium, molybdenum, or any refractory metal used in the art for silicide-cladding, followed by annealing to cause the direct reaction of the refractory metal with the underlying silicon to form silicide film 14, such direct react silicidation being well known in the art. The unreacted refractory metal or refractory metal compounds overlying field oxide 8 are subsequently removed, leaving the structure shown in FIG. 2a. As described above, the silicidation of bottom plate polysilicon 10 is not essential, but as shown in FIGS. 1 and 2a, such silicidation may be done if it is desired that polysilicon structure 10 and diffusion 6 are silicided elsewhere in the integrated circuit. As mentioned above, the voltage stability of capacitor 2 is enhanced by the silicidation of polysilicon electrode 10.

Figure 2B:
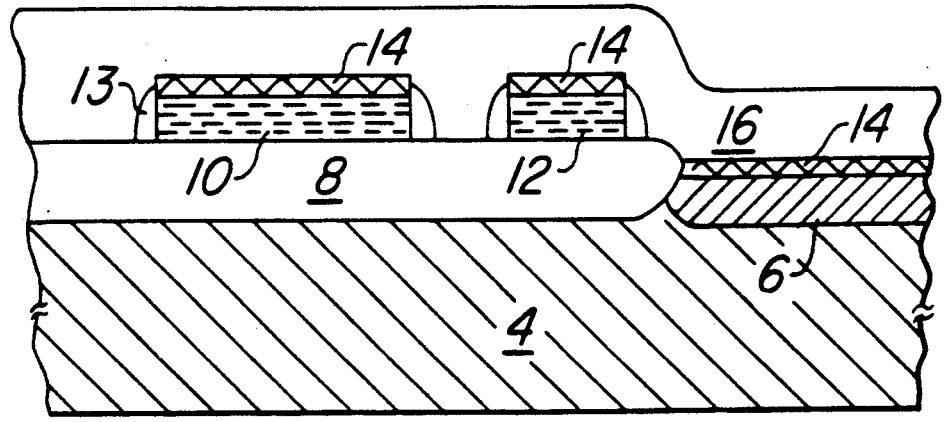
Figure 2C:
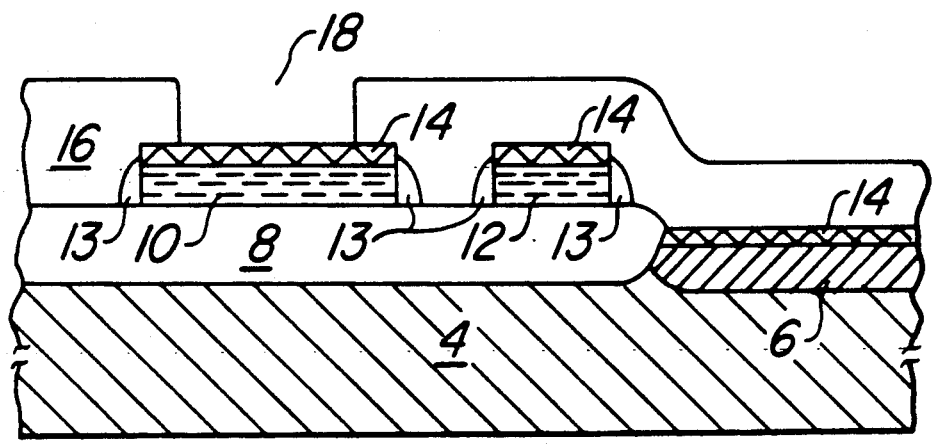

Subsequent to silicidation, a layer of multilevel dielectric 16 is deposited, by way of chemical vapor deposition or other conventional methods, over the surface of the integrated circuit, as shown in FIG. 2b. Multilevel 16 may be a conventional dielectric material used for insulation of polysilicon layers from overlying metallization. An example of a conventional multilevel dielectric 16 is phosphorous-doped silicon dioxide (PSG) or boron and phosphorous-doped silicon dioxide (BPSG). Such a multilevel dielectric is doped to provide a getterer for mobile ion contaminants such as sodium, to prevent such contaminants from reaching the underlying active components. Via 18 is then formed through multilevel 16 to silicide film 14 (if present, otherwise to polysilicon 10) at the location where capacitor 2 is to be formed, as shown in FIG. 2c. It should be noted that via 18 is not formed at the same time as contact vias to polysilicon structure 12 or to diffusion 6; such contacts will be formed later as described hereinbelow. Via 18 is patterned according to conventional photolithography techniques, and etched by conventional wet or plasma etches for the particular material of multilevel 16.

Figure 2D:
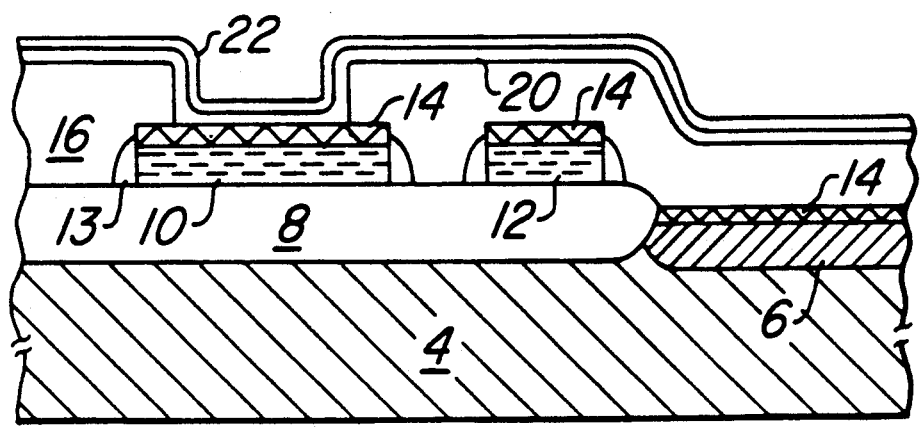

The capacitor dielectric material is now deposited over the surface of the integrated circuit, and contacting silicide film 14 at the location at which the capacitor 2 is to be formed, as shown in FIG. 2d. In this embodiment, the capacitor dielectric consists of a 25 nm thick silicon dioxide layer 20, over which a 25 nm thick silicon nitride layer 22 is formed. Preferably, both layer 20 and layer 22 are formed by way of low pressure chemical vapor deposition, which can be done at relatively low temperatures (for example, on the order of 800 degrees Celsius). An example of such a method for forming layers 20 and 22 is described in U.S. Pat. No. 4,697,330, issued Oct. 6, 1987 and assigned to Texas Instruments Incorporated. After deposition of layers 20 and 22 by way of CVD, a densification in an inert or an oxygen atmosphere at a temperature on the order of 800 degrees Celsius may be done. The low temperature of formation of layers 20 and 22 by LPCVD reduces additional vertical and lateral diffusion of diffusion 6.

It should be noted that a single layer of dielectric material, such as a single layer of silicon dioxide or a layer of oxidized silicon nitride, may be alternatively used for the dielectric of capacitor 2. Additional layers of dielectric material, such as an oxide/nitride/oxide layered dielectric, or a nitride/oxide/nitride layered dielectric as described in copending application Ser. No. 174,751 filed Mar. 29, 1988, may also be alternatively used for the capacitor dielectric.

Figure 2E:
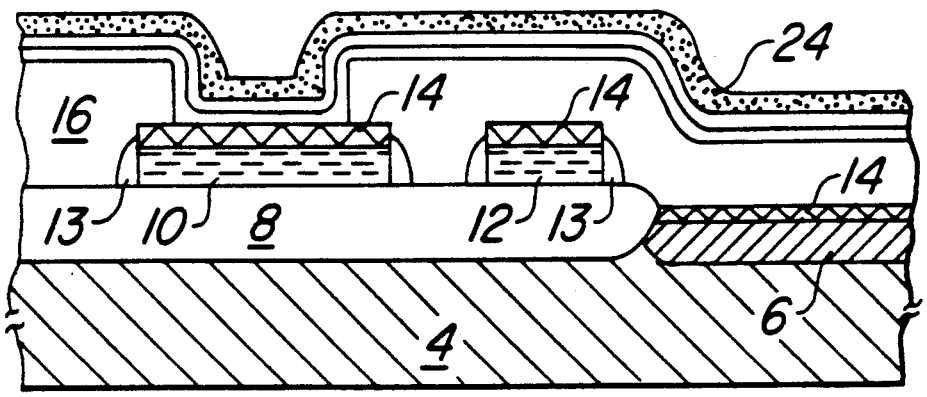

A preferred optional step in the formation of capacitor 2 is the formation of metal layer 24 over dielectric layers 20 and 22, prior to the etching of contacts to polysilicon structure 12 and to diffusion 6. FIG. 2e illustrates the integrated circuit with such a layer 24 formed. A preferred metal for the formation of layer 24 is a titanium-tungsten alloy, deposited to a thickness on the order of 50 nm. As will be described in detail below, the presence of layer 24 over the capacitor region will protect dielectric layers 20 and 22 during the contact formation steps.

Figure 2F:
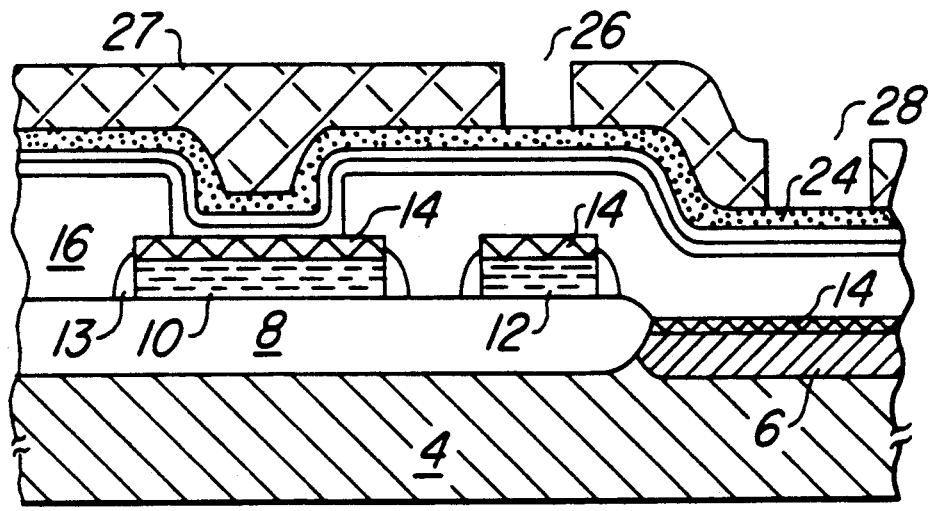
Figure 2G:
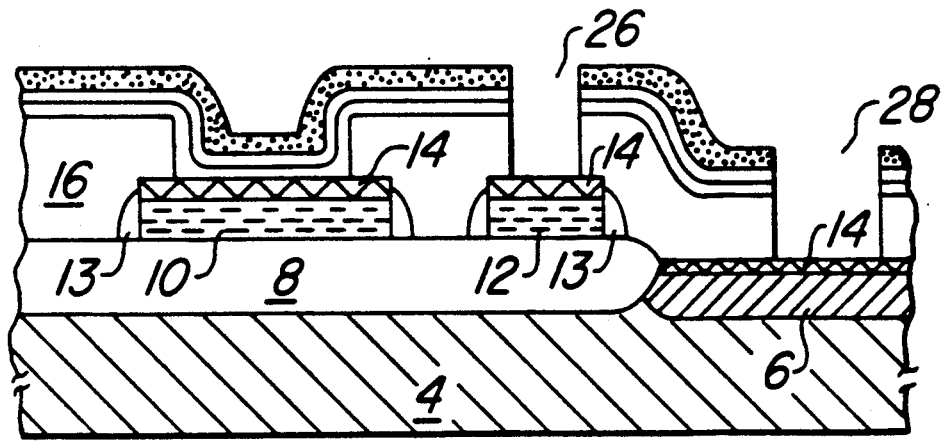

Referring now to FIG. 2f, a layer of masking material 27, for example photoresist, is shown on the surface of metal layer 24. Masking material 27 is exposed and developed according to conventional photolithography techniques to define contact locations 26 (to polysilicon structure 12) and 28 (to diffusion 6). The structure is then subjected to a plasma etch (or alternatively a wet etch) to etch through metal layer 24, and dielectric layers 22, 20 and 16, so as to expose polysilicon structure 12 at contact location 26, and diffusion 6 at contact location 28. Masking material 27 is then removed, resulting in the structure shown in FIG. 2g. It is of course preferable to stop the contact etch on silicide film 14 in the illustrated example of silicide-clad polysilicon 12 and diffusion 6.

It should be noted that metal layer 24 remains in place over dielectric layers 20 and 22 in the location at which capacitor 2 is to be formed. It is common in conventional semiconductor processing to perform a deglaze, consisting of a plasma sputter etch, or a dip of the wafer in hydrofluoric acid, for example, after the etch of contact vias and prior to the deposition of metallization. Such a deglaze clears the structures to which contact is to be made, for example polysilicon 12 at contact location 26 and diffusion 6 as contact location 28, of any native oxide which may form subsequent to the contact etch and prior to the metallization deposition. The presence of native oxide at the contact locations 26 and 28 will, of course, cause the contacts to become resistive. This deglaze will of course also etch other exposed dielectric material; if the capacitor dielectric layers 20 and 22 are exposed to the deglaze, layers 20 and 22 will of course be themselves etched thereby. The presence of metal layer 24, however, protects layer 22 from the deglaze, maintaining the dielectric of capacitor 2 as deposited.

In the embodiment described hereinabove, where a titanium-tungsten alloy is used as metal 24, either a wet deglaze of hydrofluoric acid or a plasma sputter deglaze may be used. It should further be noted that metal 24 may be formed of an aluminum, or doped aluminum layer such as silicon-doped aluminum, in which case the plasma sputter deglaze is preferred.

Alternatively to the provision of metal layer 24, layer 22 could be deposited to a greater thickness in order that the resultant thickness of layers 20 and 22 is as desired after the deglaze step; this requires that the deglaze be performed under controlled conditions. Further alternatively, the wafer could be maintained in an oxygen-free environment after the contact etch, and prior to metal deposition, precluding the formation of native oxide at contact locations 26 and 28. The use of metal layer 24, however, removes these constraints on the deglaze, and on the storage of material after contact etch, without requiring an additional mask step.

Figure 2H:
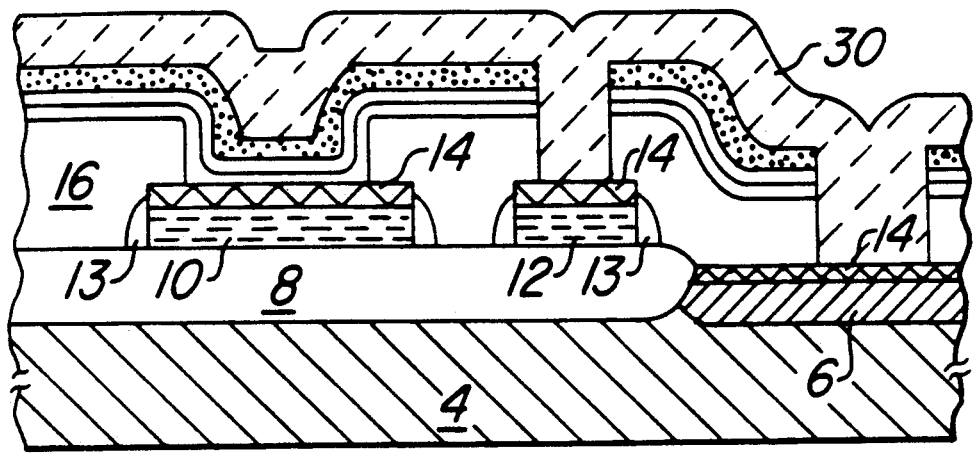

Referring now to FIG. 2h, metal layer 30 is deposited over the structure after contact etch and deglaze. Metal layer 30 can be any known composition suitable for the formation of integrated circuits. An example of metal layer 30 is an alloy of titanium-tungsten, on the order of 300 nm thick, underlying a layer copper-doped aluminum sputtered to a thickness on the order of 750 nm. It should be noted that the sputtering of metal layer 30 is generally also done at a relatively low temperature (on the order of 350 degrees Celsius). The thickness of metal layer 30 is of course sufficient to fill contact locations 26 and 28 to polysilicon structure 12, and diffusion 6, as well as to cover metal layer 24 within the depression over polysilicon structure 10 in the location of capacitor 2. A mask is patterned over metal layer 30 to define the locations of the metal lines on the integrated circuit, and metal layer 30 and metal layer 24 are both etched by a known metal etch. Metal layers 24 and 30 are of course cleared from the surface of dielectric layers 20 and 22 at the locations where no metal connection is to be made. As a result, the structure shown in FIG. 1 is fabricated.

Figure 3:
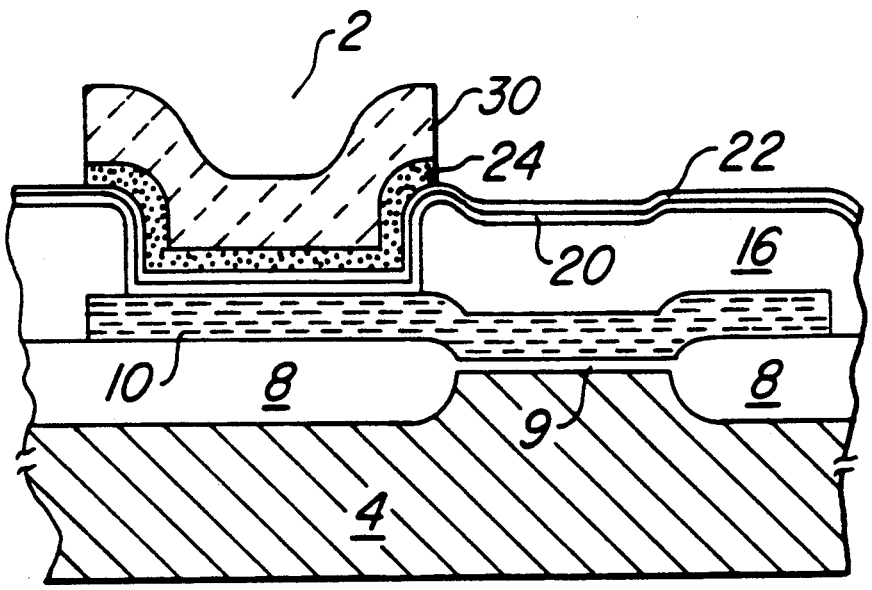
FIG. 3. is a cross-sectional view of a floating-gate transistor constructed according to the invention.
Figure 4:
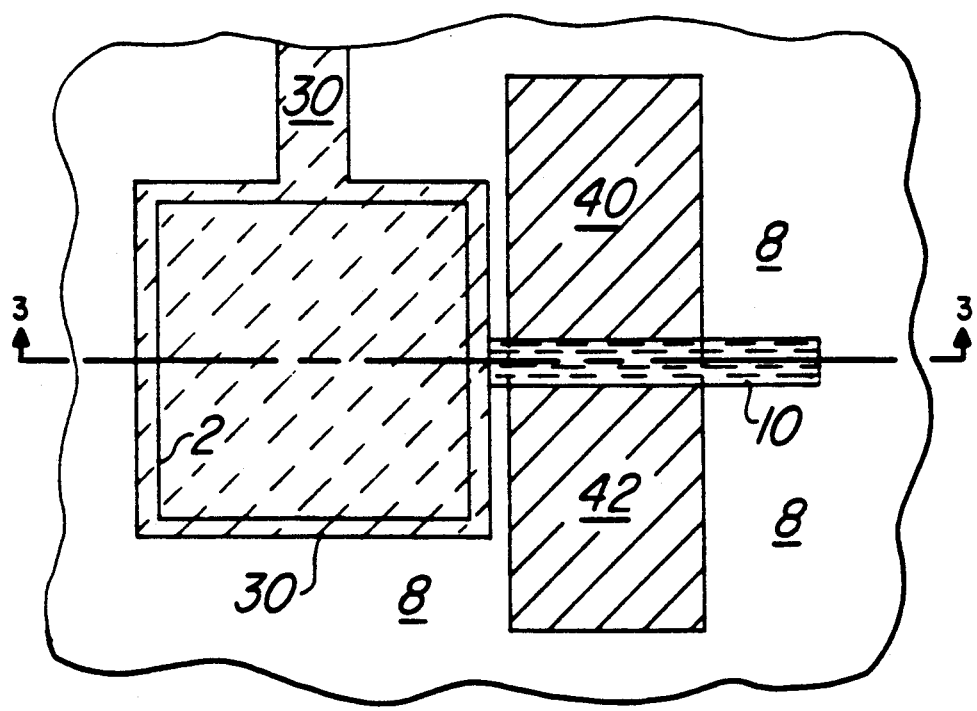
FIG. 4 is a plan view of the floating gate transistor of FIG. 3.

Referring now to FIGS. 3 and 4, a floating-gate transistor is shown incorporating capacitor 2 formed substantially as described hereinabove. The transistor of FIGS. 3 and 4 does not incorporate the formation of silicide film 14 described above; the use of silicide film 14 may of course be used in the transistor of FIGS. 3 and 4, if desired Like reference numerals are used in FIGS. 3 and 4 as were used in FIGS. 1 and 2a through 2h.

Referring to FIG. 3, capacitor 2 is shown substantially as in FIG. 1. Polysilicon 10, however, extends from under capacitor 2 off the edge of field oxide 8 so as to overly a thin gate oxide layer 9 in a moat region. As shown in plan view in FIG. 4, polysilicon 10 separates n-type diffusion regions 40 and 42, diffusion 40 serving as the drain of an MOS transistor and diffusion 42 serving as the source. Polysilicon 10 extends onto field oxide 8 on the opposite side of the moat region from capacitor 2, and is electrically isolated.

The floating gate transistor of FIGS. 3 and 4 thus has polysilicon 10 as the floating gate, and metal layers 24 and 30 (i.e., the top plate of capacitor 2) as the control gate. Capacitor 2 capacitively couples a signal placed on metal layer 30 to polysilicon 10, allowing for the programming and reading of the floating-gate transistor of FIGS. 3 and 4 in the manner conventional for electrically programmable read-only-memory (EPROM) devices and electrically erasable programmable read-only-memory (EEPROM) devices.

Figure 5:
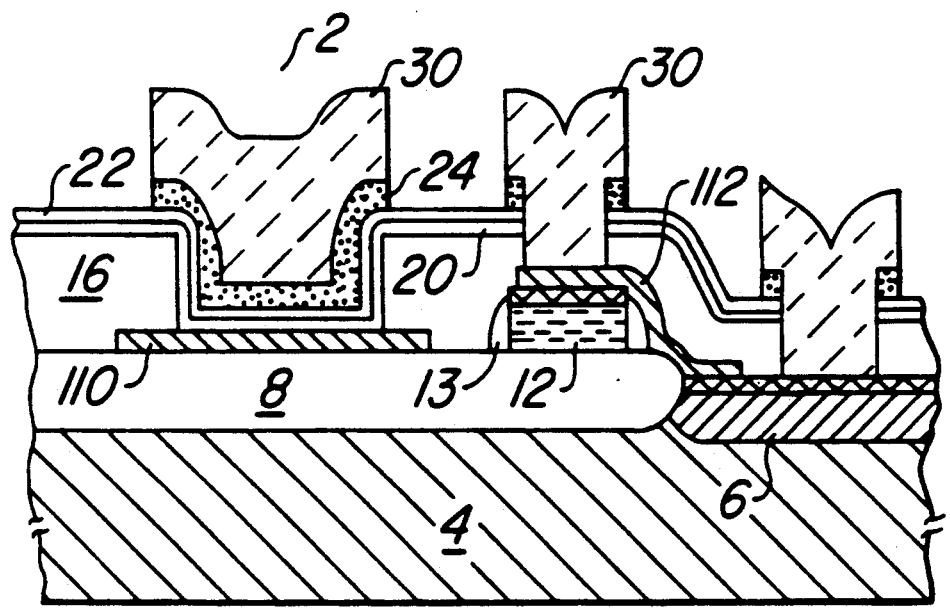
FIG. 5 is a cross-sectional view of another embodiment of a capacitor constructed according to the invention.

Referring to FIG. 5, an alternative embodiment of a capacitor 2 constructed according to the invention is illustrated. This capacitor 2 has a first plate 110 which is constructed of the unreacted refractory metal, or a conductive compound of the unreacted refractory metal, which is formed over field oxide 8 in the direct react silicidation step described above. As described in parent application Ser. No. 938,653, when titanium is used as the metal for the silicidation, a layer of titanium nitride forms over the locations where the titanium metal is not in contact with silicon, as well as on top of the silicide formed at the locations where the metal is in contact with silicon, when the silicidation is performed in a nitrogen atmosphere. Alternatively, conductive compounds such as titanium oxide, titanium oxy/nitride, or a mixture thereof with titanium nitride may be formed over field oxide 8 by the silicidation process, depending upon the process conditions. As described in parent application Ser. No. 938,653, the conductive compound may be patterned and etched to form local interconnect 112 (connecting diffusion 6 to polysilicon structure 12), and also to form first capacitor plate 110. After the patterning step to form local interconnect 112 and first plate 110, the formation of capacitor 2 continues as described above relative to FIGS. 2b through 2h, resulting in the structure of FIG. 5.

As noted above, first plate 110 may be formed of the unreacted metal from the silicidation reaction if the silicidation is done in an environment which does not cause reaction with the refractory metal layer used to form the silicide. For example, if molybdenum is used as the refractory metal to form molybdenum silicide film 14 in a direct reaction, local interconnect 112 and first plate 110 would be formed of molybdenum, rather than a conductive compound thereof.

Figure 6:
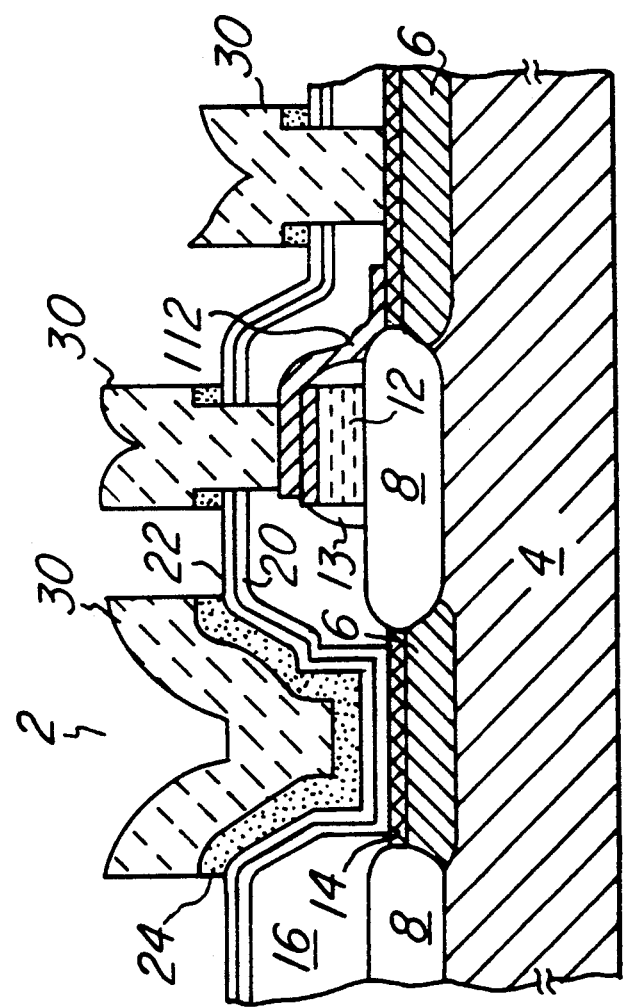
FIG. 6 is a cross-sectional view of another embodiment of a capacitor constructed according to the invention.

Referring now to FIG. 6, another embodiment of a capacitor formed according to the invention is illustrated. In this embodiment, the lower plate of capacitor 2 is formed by a diffusion region 6 which is clad with a refractory metal silicide 14, as described above. The capacitor is formed by the etching of a contact through multilevel dielectric 16 as in the above-described embodiments, only with the etching taking place over silicide-clad diffusion region 6 rather than over a polysilicon layer as before. The capacitor dielectric is formed by way of deposited oxide layer 20 underlying nitride layer 22, as in the prior embodiments, and the upper plate of capacitor 2 is formed by the two levels of metal 24 and 30 as described above. Even though the lower plate is formed in a diffusion 6, the formation of the capacitor is done after deposition of the multilevel dielectric 16 as before.

It should be noted that, for each of the above embodiments, the capacitor is formed at a relatively late stage in the manufacturing flow, i.e., after the formation of transistors and underlying polysilicon interconnection levels. Accordingly, the manufacturing process used to form an integrated circuit including a capacitor according to the invention, up to the point at which the opening in multilevel dielectric 16 is performed, may be made identical with the manufacturing process for other integrated circuits not including the capacitor. This ability to standardize manufacturing flows is a significant advantage provided by the invention, besides the other advantages noted above concerning the performance of the capacitor.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. An integrated circuit comprising selected polysilicon structures and diffusion regions, and at least one capacitor formed at predetermined locations at the surface of a semiconductor body, comprising:

a bottom plate comprising a diffusion region formed at said surface;

a multilevel dielectric layer disposed outwardly of said semiconductor body so as to cover said selected polysilicon structures and diffusion areas, and said dielectric layer defining an opening so as to expose a selected capacitor portion of said bottom plate;

a capacitor dielectric layer, disposed outwardly of said multilevel dielectric and in contact with said capacitor portion of said bottom plate, and extending over said multilevel dielectric elsewhere;

a top plate, comprising a metal layer, disposed over and in contact with said capacitor dielectric layer at a location overlying said capacitor portion of said bottom plate.

2. The capacitor of claim 1, wherein said top plate comprises:

a first metal layer in contact with said capacitor dielectric; and a second metal layer in contact with said first metal layer.

3. The capacitor of claim 2, wherein said first metal layer comprises titanium and tungsten.

4. The capacitor of claim 2, wherein said first metal layer comprises aluminum.

5. The capacitor of claim 1, wherein said bottom plate further comprises a silicide film disposed over said diffusion region.

6. The capacitor of claim 1, Wherein said capacitor dielectric comprises silicon dioxide.

7. The capacitor of claim 1, wherein said capacitor dielectric comprises silicon nitride.

8. The capacitor of claim 7, wherein said capacitor dielectric further comprises silicon dioxide.

9. The capacitor of claim 1, wherein said capacitor dielectric comprises:

a layer of silicon dioxide; and a layer of silicon nitride.

10. The capacitor of claim 9, wherein said layer of silicon nitride overlies said layer of silicon dioxide.

11. The capacitor of claim 10, wherein said capacitor dielectric further comprises a second layer of silicon dioxide overlying said layer of silicon nitride.

12. The capacitor of claim 10, wherein said capacitor dielectric further comprises a second layer of silicon nitride overlying said layer of silicon dioxide.

13. The capacitor of claim 9, wherein said layer of silicon dioxide overlies said layer of silicon nitride.

14. The capacitor of claim 1 wherein said multilevel dielectric layer is a doped silicon dioxide.

* * * * *